(12) United States Patent
Iwakura

(10) Patent No.: US 9,608,180 B2
(45) Date of Patent: Mar. 28, 2017

(54) LIGHT EMITTING DEVICE

(71) Applicant: NICHIA CORPORATION, Anan-shi, Tokushima (JP)

(72) Inventor: Daisuke Iwakura, Komatsushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/273,298

(22) Filed: Sep. 22, 2016

(65) Prior Publication Data

US 2017/0012185 A1    Jan. 12, 2017

Related U.S. Application Data

(63) Continuation of application No. 14/318,320, filed on Jun. 27, 2014, now Pat. No. 9,484,507.

(30) Foreign Application Priority Data

Jun. 28, 2013 (JP) ................. 2013-137500

(51) Int. Cl.
*H01L 33/54* (2010.01)
*H01L 33/50* (2010.01)
*H01L 33/62* (2010.01)

(52) U.S. Cl.
CPC ............ *H01L 33/54* (2013.01); *H01L 33/508* (2013.01); *H01L 33/62* (2013.01); *H01L 2933/005* (2013.01); *H01L 2933/0033* (2013.01)

(58) Field of Classification Search
USPC ............... 257/98; 313/499, 502, 501, 498
See application file for complete search history.

(56) References Cited

U.S. PATENT DOCUMENTS

| | | |
|---|---|---|
| 6,351,069 B1 | 2/2002 | Lowery et al. |
| 8,547,009 B2 | 10/2013 | Hussell et al. |
| 8,785,957 B2 | 7/2014 | Hata et al. |
| 2003/0006702 A1 | 1/2003 | Mueller-Mach |
| 2006/0193121 A1 | 8/2006 | Kamoshita |
| 2008/0054279 A1 | 3/2008 | Hussell et al. |
| 2011/0297987 A1 | 12/2011 | Koizumi et al. |
| 2012/0112623 A1 | 5/2012 | Kobashi |

(Continued)

FOREIGN PATENT DOCUMENTS

| | | |
|---|---|---|
| JP | 2000-244021 A | 9/2000 |
| JP | 2002-305328 A | 10/2002 |

(Continued)

OTHER PUBLICATIONS

Non-Final Rejection of U.S. Appl. No. 14/323,684 mailed Mar. 10, 2015.

(Continued)

*Primary Examiner* — Telly Green
(74) *Attorney, Agent, or Firm* — Foley & Lardner LLP

(57) ABSTRACT

A light emitting device comprises a package having a recess; a light emitting element mounted in the recess of the package; a light transmissive member provided above the light emitting element; a sealing resin that seals the recess of the package; and a fluorescent material contained in the sealing resin. The fluorescent material is distributed to a side of the light emitting element in a greater amount than to above the light emitting element, a side surface of the light emitting element is exposed to the sealing resin, and a portion of the light transmissive member protrudes from the sealing resin.

19 Claims, 9 Drawing Sheets

(56) References Cited

U.S. PATENT DOCUMENTS

| | | |
|---|---|---|
| 2013/0062649 A1 | 3/2013 | Hata et al. |
| 2014/0151739 A1 | 6/2014 | Koizumi et al. |

FOREIGN PATENT DOCUMENTS

| | | |
|---|---|---|
| JP | 2003-273409 A | 9/2003 |
| JP | 2005-158949 A | 6/2005 |
| JP | 2005-347467 A | 12/2005 |
| JP | 2006-135300 A | 5/2006 |
| JP | 2006-245020 A | 9/2006 |
| JP | 2006-303397 A | 11/2006 |
| JP | 2008-103688 A | 5/2008 |
| JP | 2008-117666 A | 5/2008 |
| JP | 2008-166462 A | 7/2008 |
| JP | 2011-091441 A | 5/2011 |
| JP | 2011-258675 A | 12/2011 |
| JP | 2012-114416 A | 6/2012 |
| JP | 2012-142430 A | 7/2012 |

OTHER PUBLICATIONS

Non-Final Office Action mailed Feb. 23, 2016 in U.S. Appl. No. 14/318,320.

Non-Final Office Action mailed Sep. 23, 2015 in U.S. Appl. No. 14/318,320.

Notice of Allowance mailed Jul. 28, 2016 in U.S. Appl. No. 14/318,320.

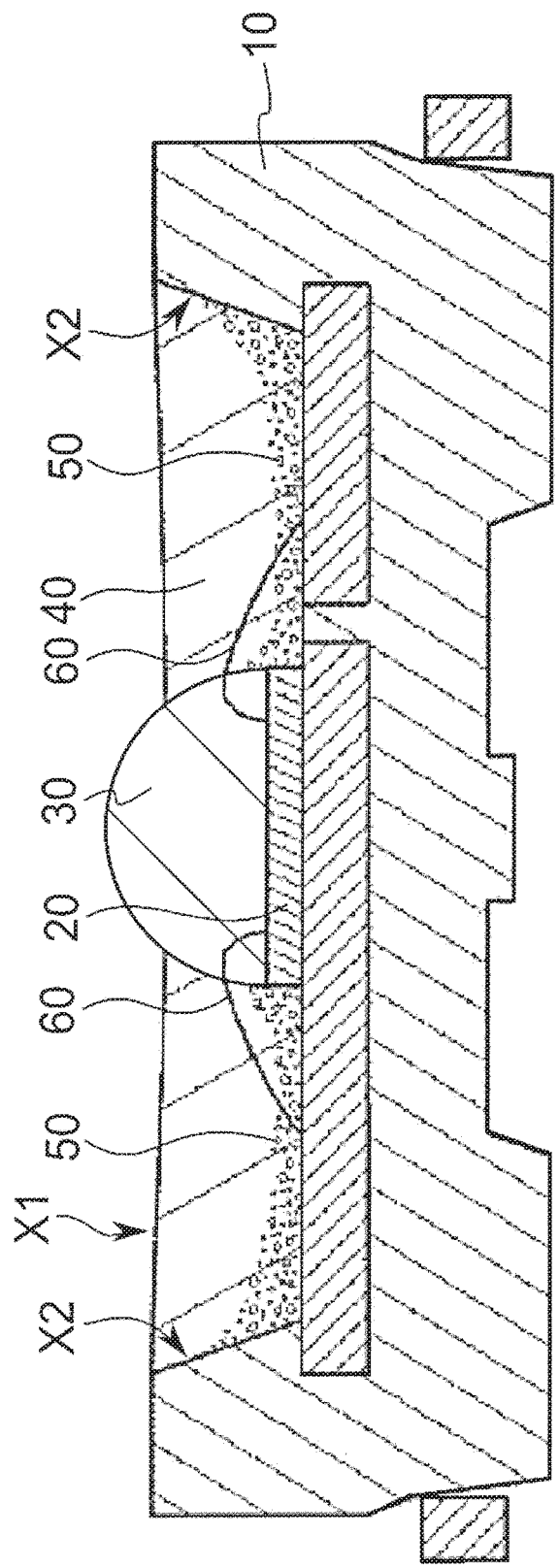

LIGHT EMITTING DEVICE

CROSS REFERENCE TO RELATED APPLICATION

The present application is a continuation of U.S. patent application Ser. No. 14/318,320, filed Jun. 27, 2014, which claims priority based on Japanese Application No. 2013-137500, filed Jun. 28, 2013, the disclosures of which are hereby incorporated by reference in their entireties.

BACKGROUND

The present disclosure relates to a light emitting device. Conventionally, a light emitting device with a fluorescent material provided in a recess of a package mounted with a light emitting element has been disclosed (refer to Japanese Patent Application Laid-open No. 2008-103688).

SUMMARY

In one embodiment, a light emitting device comprises a package having a recess; a light emitting element mounted in the recess of the package; a light transmissive member provided above the light emitting element; a sealing resin that seals the recess of the package; and a fluorescent material contained in the sealing resin, wherein the fluorescent material is distributed to a side of the light emitting element in a greater amount than to above the light emitting element, a side surface of the light emitting element is exposed to the sealing resin, and a portion of the light transmissive member protrudes from the sealing resin.

BRIEF DESCRIPTION OF THE DRAWINGS

FIG. 4B is a schematic cross-sectional view the light emitting device depicted in FIG. 4A, taken along the line A-A in FIG. 4A;

DETAILED DESCRIPTION OF THE EMBODIMENTS

[Light Emitting Device According to a First Embodiment]

Figure 1:
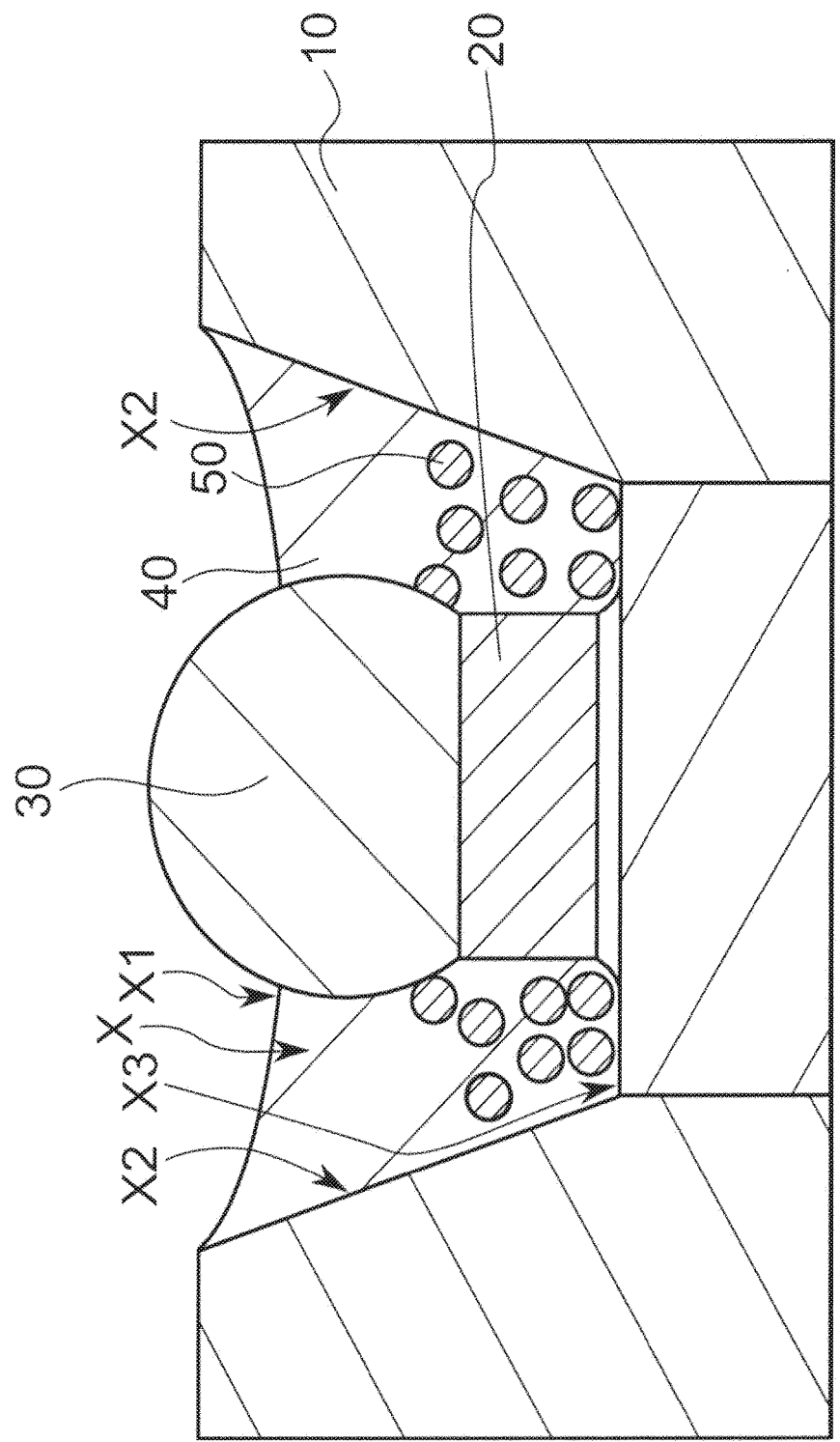
FIG. 1 is a schematic view illustrating a light emitting device according to a first embodiment.

FIG. 1 is a schematic view illustrating a light emitting device according to a first embodiment.

As shown in FIG. 1, the light emitting device according to the first embodiment includes a package 10 having a recess X, a light emitting element 20 mounted in the recess X of the package 10, a light transmissive member 30 provided above the light emitting element 20, a sealing resin 40 that seals the recess X of the package 10, and a fluorescent material 50 contained in the sealing resin 40, wherein the fluorescent material 50 is distributed to a side of the light emitting element 20 in a greater amount than to above the light emitting element 20, a side surface of the light emitting element 20 is exposed to the sealing resin 40, and a portion of the light transmissive member 30 protrudes from the sealing resin 40. With the light emitting device according to the present embodiment, since the fluorescent material is distributed to the side of the light emitting element in a greater amount than to above the light emitting element, light emitted from the side surface of the light emitting element can be efficiently used to excite the fluorescent material.

(Package 10)

For the package 10, for example, a thermoplastic resin such as PPA (polyphthalamide), PPS (polyphenylene sulfide), liquid crystal polymer, and nylon, a thermosetting resin such as epoxy resin, silicone resin, modified epoxy resin, modified silicone resin, urethane resin, and acrylate resin as well as glass epoxy resin, ceramics, glass, or the like may be used. As ceramics, particularly, alumina, aluminum nitride, mullite, silicon carbide, or silicon nitride is preferably used. Alumina ormullite are particularly preferable due to the high reflectance and low cost.

The recess X included in the package 10 has a bottom surface X3 that is flat enough to allow the light emitting element 20 to be mounted and has a shape that can be filled by the sealing resin 40. Examples of such a recess X include a recess with a trapezoidal cross section (refer to FIG. 1). With the package 10 having a recess with a trapezoidal cross section, since light emitted from the light emitting element 20 is reflected at a side wall X2 of the recess toward an opening X1 of the recess, light extraction efficiency of the light emitting device is improved.

(Light Emitting Element 20)

A light emitting diode may be used as the light emitting element 20. As the light emitting diode, for example, a light emitting diode may be used which has a growth substrate (for example, a sapphire substrate) with insulating and light-transmitting properties and a laminated structure including an active layer formed on the growth substrate. Moreover, the laminated structure including an active layer may be formed by various semiconductors (for example, a nitride semiconductor such as InN, AlN, GaN, InGaN, AlGaN, and InGaAlN, a III-V group compound semiconductor, and a II-VI group compound semiconductor).

While a mounting method of the light emitting element 20 is not particularly limited, for example, the light emitting element 20 can be mounted to the recess X of the package 10 by arranging the growth substrate to be a mounting surface. In this case, for example, the light emitting element 20 is electrically connected to an external electrode of the package 10 by wire bonding. On the other hand, the light emitting element 20 can be mounted to the recess X of the package 10 by arranging the side of the laminated structure including an active layer to be a mounting surface. In this case, for example, the light emitting element 20 is electrically connected to an external electrode of the package 10 by flip-chip mounting.

The side surface of the light emitting element 20 is exposed to the sealing resin 40. Even if the fluorescent material 50 is distributed to the side of the light emitting element 20 in a larger amount than to above the light emitting element 20, if the light transmissive member 30 coats the side surface of the light emitting element 20, light emitted from the side surface of the light emitting element 20 is reflected (in particular, totally reflected) by the light transmissive member 30. Therefore, in this case, light emitted from the side surface of the light emitting element 20 cannot be efficiently used to excite the fluorescent material 50. However, by exposing the side surface of the light emitting element 20 to the sealing resin 40, since the side surface of the light emitting element 20 is not coated by the light transmissive member 30, light emitted from the side surface of the light emitting element 20 can be efficiently used to excite the fluorescent material 50.

(Light Transmissive Member 30)

A member having a property of transmitting light from the light emitting element 20 is used as the light transmissive member 30. Although the degree of light transmissions not particularly limited, for example, in addition to the property of a member that transmits 100% of light emitted from the light emitting element 20, a member that transmits around 70% or more, 80% or more, 90% or more, or 95% or more of light emitted from the light emitting element 20 is preferably used as the light transmissive member 30.

As the light transmissive member 30, a member having light-resistant and insulating properties in addition to transmitting light from the light emitting element 20 is preferably used. Examples of members having such properties include organics such as silicone resin, epoxy resin, urea resin, fluororesin and hybrid resins containing at least one of these resins (for example, a silicone resin composition, a modified silicone resin composition, an epoxy resin composition, a modified epoxy resin composition, and an acrylic resin composition).

While the light transmissive member 30 may be provided above the light emitting element 20, the light transmissive member 30 is preferably provided at a position where an amount of the fluorescent material 50 that is distributed in an area sandwiched between the light transmissive member 30 and the light emitting element 20 is small and is more preferably provided on an upper surface of the light emitting element 20 as shown in FIG. 1. Accordingly, since the amount of the fluorescent material 50 distributed above the light emitting element 20 is reduced (or becomes zero), the light emitted from the upper surface of the light emitting element 20 is less frequently reflected by the fluorescent material 50 and, as a result, the light emitted from the upper surface of the light emitting element 20 can be more easily extracted from the recess opening X1 of the package 10.

A portion of the light transmissive member 30 protrudes from the sealing resin 40. Accordingly, an interface between the portion of the light transmissive member 30 that protrudes from the sealing resin 40 and outside air is formed in the opening X1 of the recess of the package 10. As shown in FIG. 1, since the surface of the sealing resin 40 is recessed due to sinking, a total reflection is likely to occur at an interface between the sealing resin 40 and outside air. In comparison, since the interface between the portion of the light transmissive member 30 that protrudes from the sealing resin 40 and outside air has a smaller degree of recess than the recess caused by sinking that is formed on the surface of the sealing resin 40, total reflection is less likely to occur than the interface between the sealing resin 40 and outside air. Therefore, when a portion of the light transmissive member 30 protrudes from the sealing resin 40, a total reflection at the opening X1 of the recess of the package 10 is reduced and light extraction efficiency of the light emitting device is improved. Moreover, while the interface between the portion of the light transmissive member 30 that protrudes from the sealing resin 40 and outside air is formed as a protruding curved surface in the example shown in FIG. 1, a protruding curved surface is an example of an interface with a smaller degree of recess than the recess caused by sinking that is formed on the surface of the sealing resin 40.

A member having a surface that prevents deposition of the fluorescent material 50 is preferably used as the light transmissive member 30. Accordingly, since the amount of the fluorescent material 50 distributed above the light emitting element 20 is reduced (or becomes zero), the light emitted from the upper surface of the light emitting element 20 is less frequently reflected by the fluorescent material 50 and, as a result, the light emitted from the upper surface of the light emitting element 20 can be more easily extracted from the opening X1 of the recess of the package 10.

The light transmissive member 30 preferably has a cross section with a shape of a circle (for example, an exact circle or an ellipse) having a part thereof cut away and, in the cross sectional view, a cutaway side faces the light emitting element 20 (refer to FIG. 1). Accordingly, since a surface of the portion of the light transmissive member 30 that protrudes from the sealing resin 40 is formed as a curved surface, reflection (in particular, total reflection) that may occur at an interface between this portion and outside air can be suppressed. Therefore, light can be efficiently emitted from a surface of the portion of the light transmissive member 30 that protrudes from the sealing resin 40. In addition, by adopting such a configuration, since a portion of the light transmissive member 30 that does not protrude from the sealing resin 40 (a portion that exists inside the sealing resin 40) is shaped so as to include a curved surface, deposition of the fluorescent material 50 is less likely to occur on the surface of the light transmissive member 30 in the sealing resin 40. As a result, the fluorescent material 50 is more likely to be deposited to the side of the light emitting element 20.

For example, the light transmissive member 30 can be provided by potting a thermosetting resin on an upper surface of the light emitting element 20 and hardening the thermosetting resin. Accordingly, due to surface tension of the thermosetting resin, a surface of the portion of the light transmissive member 30 that does not protrude from the sealing resin 40 (a portion that exists inside the sealing resin 40) acquires a shape that prevents deposition of the fluorescent material 50.

On the other hand, in the case of flip-chip mounting, since an upper surface of the light emitting element 20 is a flat surface, the light transmissive member 30 may be provided by bonding the light transmissive member 30 to the upper surface of the light emitting element 20. For example, in the case of using a light emitting diode having positive and negative electrodes on a same surface, the light transmissive member 30 can be easily bonded to the upper surface of the light emitting element 20.

A microstructure such as recesses and projections or a microlens is preferably provided on the surface of the light transmissive member 30. Accordingly, since reflection at an interface between the sealing resin 40 and the portion of the light transmissive member 30 that does not protrude from the sealing resin 40 (a portion that exists inside the sealing resin 40) as well as an interface between the light transmissive member 30 and outside air is reduced, light extraction efficiency of the light emitting device increases. Moreover, since the sealing resin 40 is not hardened and readily spreads to its surroundings during a forming step thereof, even if recesses and projections are formed on the light transmissive member 30, the fluorescent material 50 does not accumulate (or only a small amount accumulates) on the recesses and projections.

(Sealing Resin 40)

Materials similar to those described above with respect to the light transmissive member 30 may be used as the sealing resin 40.

For example, the sealing resin 40 is provided by potting a resin in the recess X of the package 10 and hardening the resin.

(Fluorescent Material 50)

The fluorescent material 50 exists to the side of the light emitting element 20 in a larger amount than to above the light emitting element 20. Accordingly, since the amount of the fluorescent material 50 distributed above the light emitting element 20 becomes smaller than the amount of the fluorescent material 50 distributed to the side of the light emitting element 20 (or becomes zero), the light emitted from the upper surface of the light emitting element 20 is less frequently reflected by the fluorescent material 50 and, as a result, the light emitted from the upper surface of the light emitting element 20 can be more easily extracted from the opening X1 of the recess of the package 10. In addition, since the amount of the fluorescent material 50 distributed to the side of the light emitting element 20 becomes larger than the amount of the fluorescent material 50 distributed above the light emitting element 20, the light emitted from the side surface of the light emitting element 20 can be efficiently used to excite the fluorescent material 50. Moreover, when the light emitted from the side surface of the light emitting element 20 is efficiently used to excite the fluorescent material 50, since it is more difficult for the light emitted from the side surface of the light emitting element 20 to reach the side wall X2 of the recess of the package 10, the light emitted from the side surface of the light emitting element 20 can be prevented from passing through the side wall X2 of the recess of the package 10 and exiting outside the package 10.

Examples of the distribution described above include a mode such as that shown in FIG. 1 where the fluorescent material 50 is deposited on the bottom surface X3 of the recess of the package 10. Such a mode can be formed by, for example, depositing the fluorescent material 50 in the recess X of the package 10 before hardening the sealing resin 40.

As the fluorescent material 50, a fluorescent material that is excited by light emitted from the light emitting element 20 and emits light may be used. While a fluorescent material that emits light with a shorter wavelength than the light emitted from the light emitting element 20 may be used, a fluorescent material that emits light with a longer wavelength is more preferable. Accordingly, since the fluorescent material can efficiently emit light, light extraction efficiency of the light emitting device increases.

Examples of materials that may be used as a fluorescent material that emits light with a longer wavelength than the light emitted from the light emitting element 20 include a nitride-based fluorescent phosphor or an oxynitride-based fluorescent phosphor that is mainly activated by a lanthanoid element such as Eu and Ce and, more specifically, an α or β sialon-type fluorescent phosphor that is activated by Eu, various alkaline-earth metal silicate nitride fluorescent bodies, an alkaline-earth metal halogen apatite fluorescent phosphor, an alkaline-earth halosilicate fluorescent phosphor, an alkaline-earth metal silicate fluorescent phosphor, an alkaline-earth metal halogen borate fluorescent phosphor, an alkaline-earth metal aluminate fluorescent phosphor, an alkaline-earth metal silicate, an alkaline-earth metal sulfide, an alkaline-earth metal thiogallate, an alkaline-earth metal silicon nitride, and germanate that are mainly activated by a lanthanoid element such as Eu or a transition metal element such as Mn, a rare-earth aluminate and a rare-earth silicate that are mainly activated by a lanthanoid element such as Ce, and organics, organic complexes, and the like that are mainly activated by a lanthanoid element such as Eu. Obviously, fluorescent materials which produce similar performance and effects to the fluorescent materials described above may be used instead. Moreover, when a nitride semiconductor-based light emitting element is used as the light emitting element 20, for example, a fluorescent material such as a YAG fluorescent material (yellow fluorescent material) or a LAG fluorescent material (yellow fluorescent material) is preferably used.

When the fluorescent material 50 is deposited lower than the active layer of the light emitting element 20 to the side of the light emitting element 20, since light emitted from a side surface in an area below the active layer of the light emitting element 20 (for example, the growth substrate) enters the fluorescent material 50 immediately after being emitted, the light emitted from a side surface in an area below the active layer of the light emitting element 20 (for example, the growth substrate) can be efficiently used to excite the fluorescent material 50.

On the other hand, when the fluorescent material 50 is deposited higher than the active layer of the light emitting element 20 to the side of the light emitting element 20, since light emitted from a side surface of the active layer of the light emitting element 20 enters the fluorescent material 50 immediately after being emitted in addition to light emitted from a side surface in an area below the active layer of the light emitting element 20 (for example, the growth substrate), both the light emitted from a side surface in an area below the active layer of the light emitting element 20 (for example, the growth substrate) and the light emitted from a side surface of the active layer of the light emitting element 20 can be efficiently used to excite the fluorescent material 50.

[Light Emitting Device According to a Second Embodiment]

Figure 2:
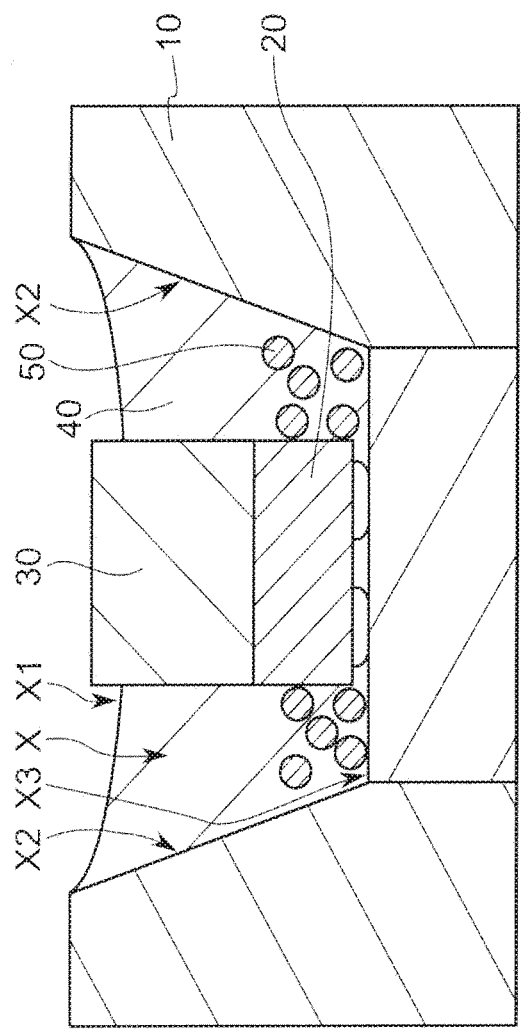
FIG. 2 is a schematic view illustrating a light emitting device according to a second embodiment.

FIG. 2 is a schematic view illustrating a light emitting device according to a second embodiment.

As shown in FIG. 2, the light emitting device according to the second embodiment differs from the light emitting device according to the first embodiment, because in the first embodiment, the interface between the portion of the light transmissive member 30 that protrudes from the sealing resin 40 and outside air is a protruding curved surface, while in the second embodiment, the interface is a flat surface.

Even according to the second embodiment, since total reflection at the opening X1 of the recess of the package 10 decreases, light extraction efficiency of the light emitting device is improved. Moreover, a flat surface is an example of an interface with a smaller degree of recess than the recess caused by sinking that is formed on the surface of the sealing resin 40.

[Light Emitting Device According to a Third Embodiment]

Figure 3:
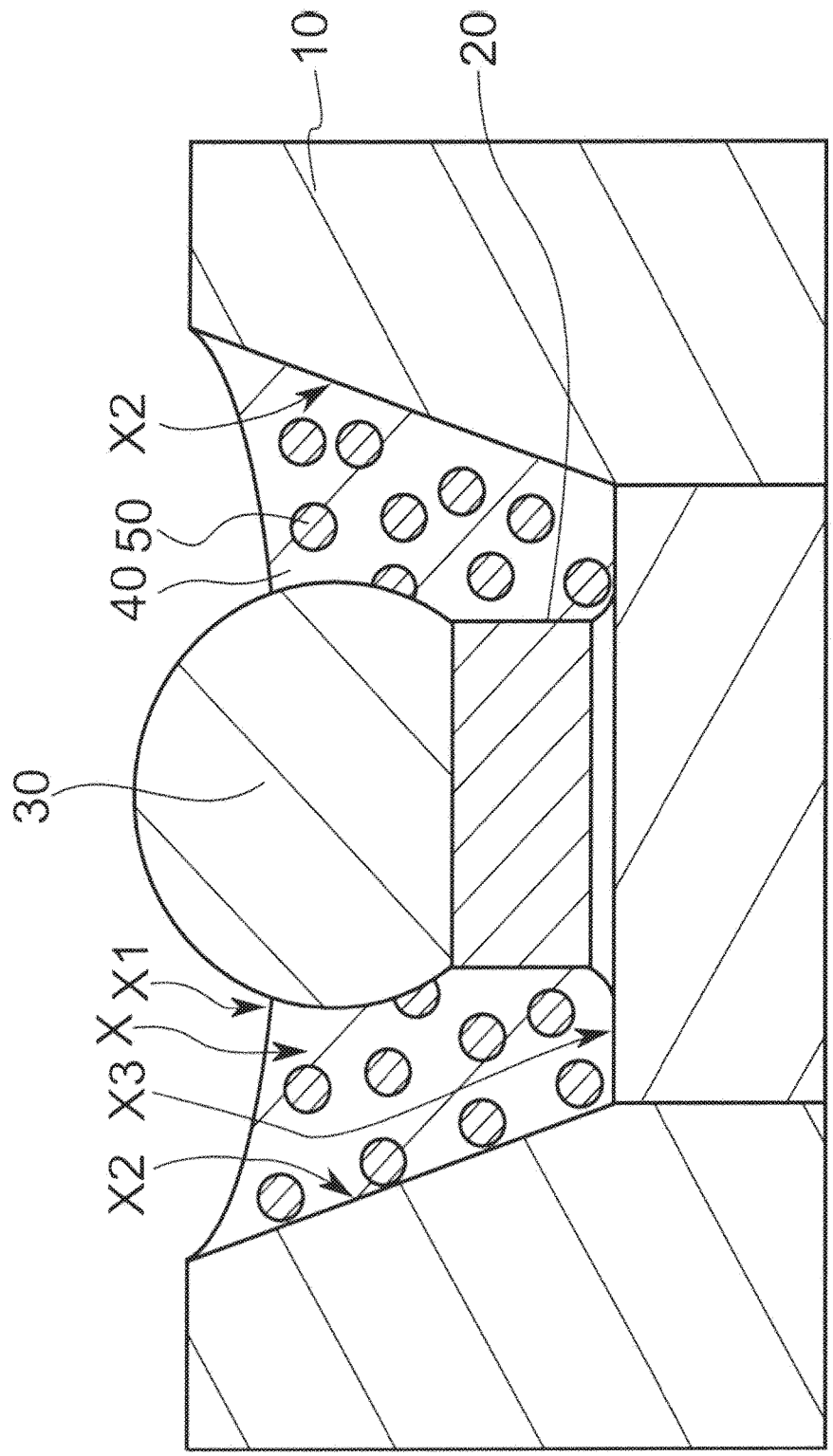
FIG. 3 is a schematic view illustrating a light emitting device according to a third embodiment.

FIG. 3 is a schematic view illustrating a light emitting device according to a third embodiment.

As shown in FIG. 3, the light emitting device according to the third embodiment differs from the light emitting device according to the first embodiment in that the fluorescent material 50 is not deposited on the bottom surface X3 of the recess of the package 10.

Even with the light emitting device according to the third embodiment, in a similar manner to the light emitting device according to the first embodiment, the fluorescent material 50 is distributed to the side of the light emitting element 20 in a larger amount than to above the light emitting element 20, a side surface of the light emitting element 20 is exposed to the sealing resin 40, and a portion of the light transmissive member 30 protrudes from the sealing resin 40.

As described above, in the light emitting devices according to the first to third embodiments, since the fluorescent material 50 is distributed to the side of the light emitting element 20 in a larger amount than to above the light emitting element 20 and a side surface of the light emitting element 20 is exposed to the sealing resin 40, light emitted from the upper surface of the light emitting element 20 is more easily extracted from the opening X1 of the recess of the package 10 and light emitted from the side surface of the light emitting element 20 can be efficiently used to excite the fluorescent material 50. In particular, with the light emitting devices according to the first to third embodiments, since a portion of the light transmissive member 30 protrudes from the sealing resin 40, a total reflection at the opening X1 of the recess of the package 10 is reduced and light extraction efficiency of the light emitting device is improved.

Moreover, the first to third embodiments can be particularly preferably applied to a light emitting device in which an electrode such as a pad electrode or an ITO is provided on the upper surface of the light emitting element 20. According to the first to third embodiments, since the light emitted from the upper surface of the light emitting element 20 is less frequently reflected by the fluorescent material 50, light reflected by the fluorescent material 50 above the light emitting element 20 is prevented from being absorbed by an electrode such as a pad electrode or an ITO and light extraction efficiency of the light emitting devices can be improved.

In addition, the first to third embodiments can be particularly preferably applied to a light emitting device in which the side wall X2 of the recess of the package 10 is thin enough to allow light to pass through the side wall X2 of the recess even when a reflective member is provided (for example, a light emitting device in which the thickness of side wall X2 of the recess of the package 10 is around 0.1 mm). According to the first to third embodiments, since the light emitted from the side surface of the light emitting element 20 can be prevented from passing through the side wall X2 of the recess of the package 10 and exiting outside the package 10, light extraction efficiency can be improved in a light emitting device in which the side wall X2 of the recess of the package 10 is thin.

Furthermore, the first to third embodiments can also be preferably applied to a light emitting element 20 that uses ceramics for the package 10. While ceramics are inorganic materials that hardly deteriorate and are highly reliable, ceramics have lower reflectance than resin materials containing light reflecting members and are more likely to transmit light from the light emitting element 20. However, according to the first to third embodiments, since the light emitted from the side surface of the light emitting element 20 can be prevented from passing through the side wall X2 of the recess of the package 10 and exiting outside the package 10, light extraction efficiency can be improved in a light emitting device that uses ceramics for the package 10.

Figure 4A:
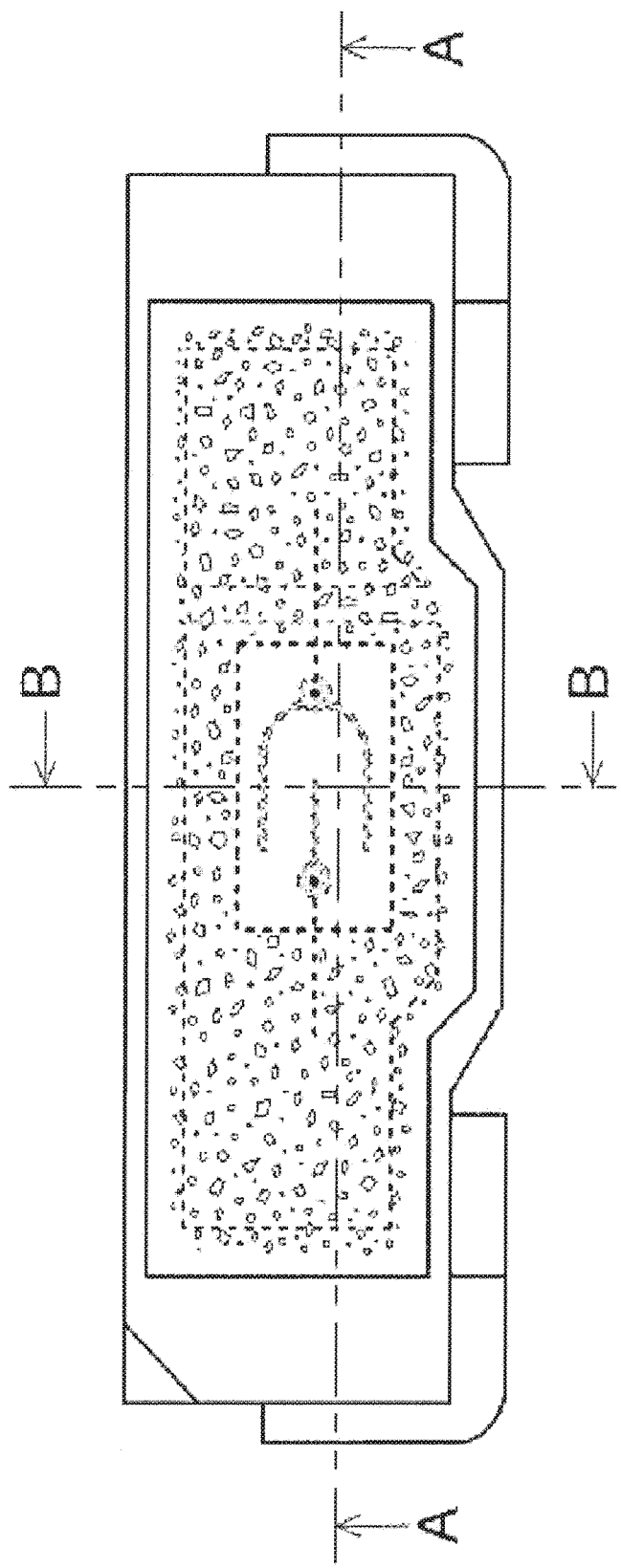
FIG. 4A is a schematic plan view of a side view type light emitting device to which the first, second, and third embodiments can be applied.
Figure 4C:
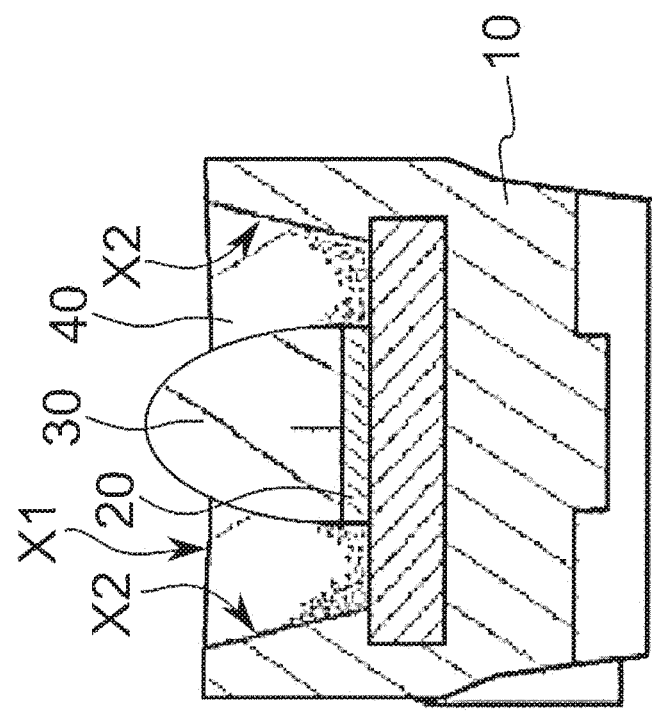
FIG. 4C is a schematic cross-sectional view of the light emitting device depicted in FIG. 4A, taken along the line B-B in FIG. 4A.

FIG. 4 is a schematic view of a side view type light emitting device to which the first to third embodiments can be applied, wherein FIG. 4A is a schematic plan view, FIG. 4B is a schematic cross-sectional view taken along the line A-A in FIG. 4A, and FIG. 4C is a schematic cross-sectional view taken along the line B-B in FIG. 4A.

The embodiments can also be applied to a side view type light emitting device such as that shown in FIG. 4. In the side view type of light emitting devices shown in FIG. 4, the light transmissive member 30 is provided on the upper surface of the light emitting element 20 by potting after the light emitting element 20 is electrically connected to an external electrode of the package 10 by wire bonding using the wire 60. In addition, the wire 60 is projected from the light transmissive member 30.

Figure 5A:
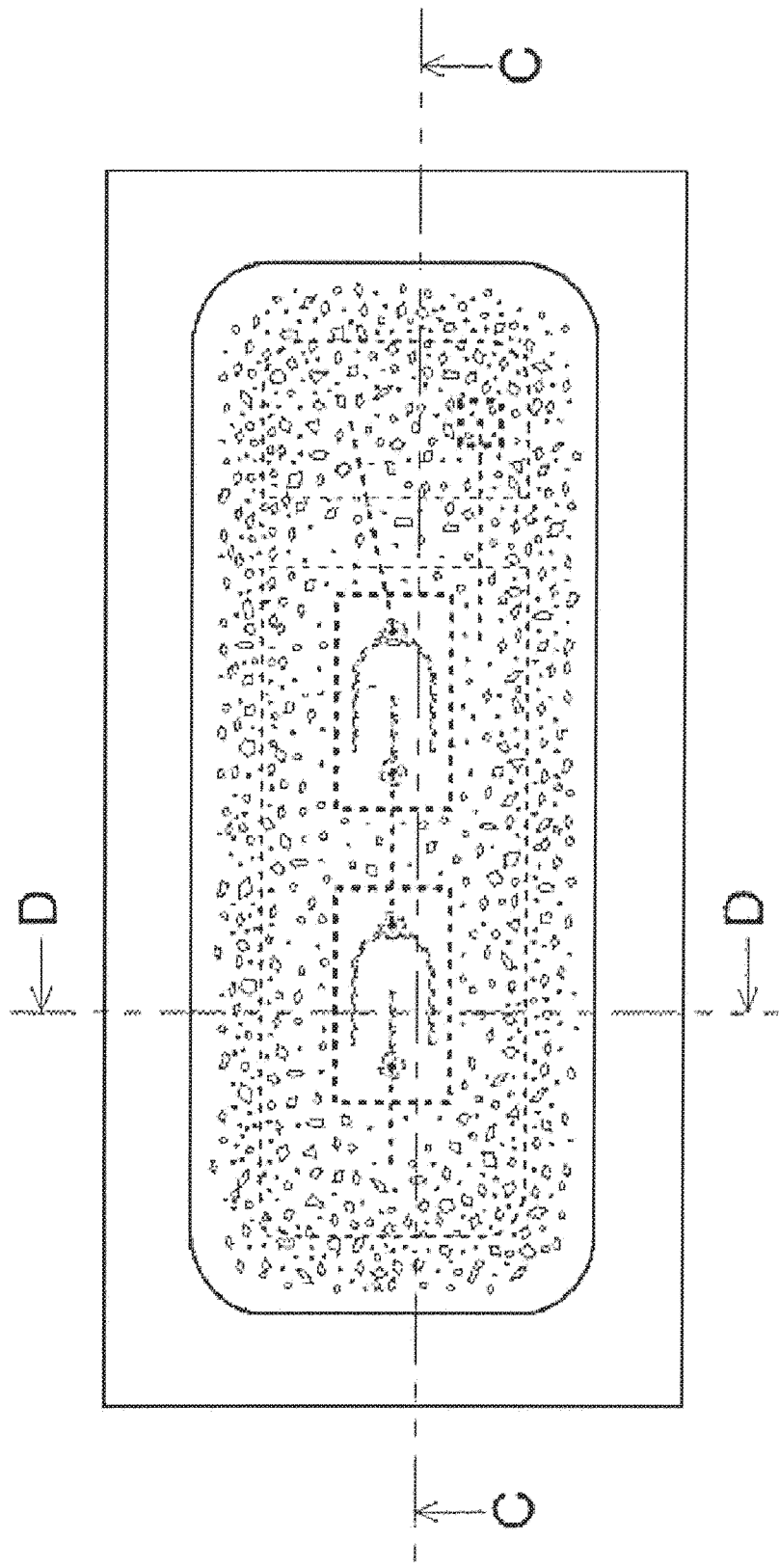
FIG. 5A is a schematic plan view of a top view type light emitting device to which the first, second, and third embodiments can be applied.
Figure 5B:
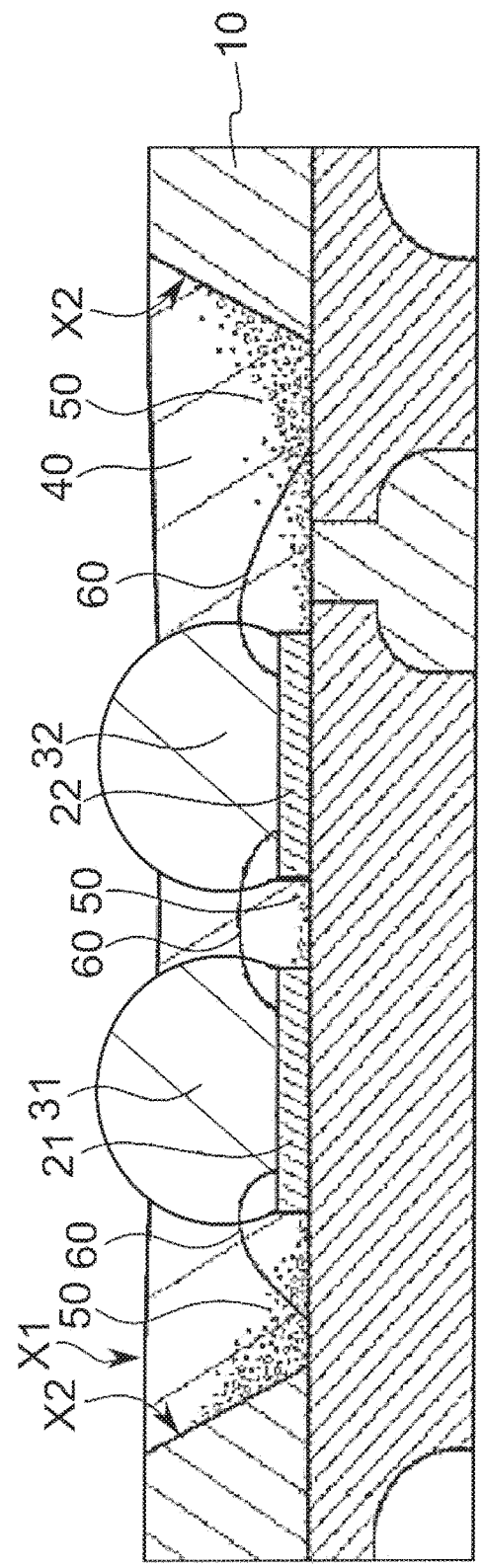
FIG. 5B is a schematic cross-sectional view the light emitting device depicted in FIG. 5A, taken along the line C-C in FIG. 5A.
Figure 5C:
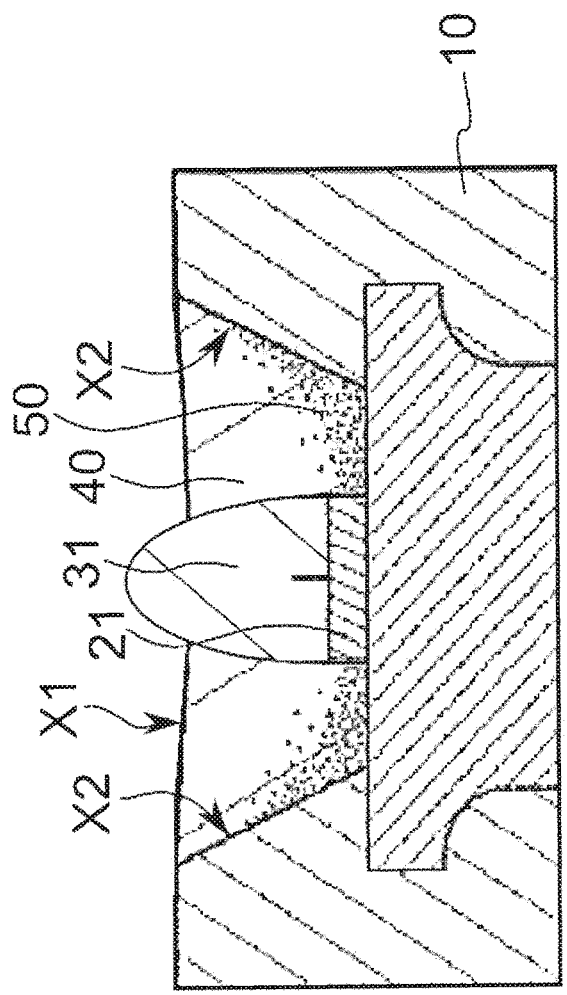
FIG. 5C is a schematic cross-sectional view of the light emitting device depicted in FIG. 5A, taken along the line D-D in FIG. 5A.

FIG. 5 is a schematic view of a top view type light emitting device to which the first to third embodiments can be applied, wherein FIG. 5A is a schematic plan view, FIG. 5B is a schematic cross-sectional view taken along the line C-C in FIG. 5A, and FIG. 5C is a schematic cross-sectional view taken along the line D-D in FIG. 5A.

The embodiments can also be applied to a top view type light emitting device such as that shown in FIG. 5. The top view type of light emitting devices shown in FIG. 5 includes a plurality of light emitting elements 21 and 22. The light emitting elements 21 and 22 are respectively provided with light transmissive members 31 and 32. The light emitting elements 21 and 22 are connected in series using the wire 60, and both ends of the wire 60 connecting the light emitting elements 21 and 22 are respectively coated by the light transmissive members 31 and 32. The fluorescent material 50 is distributed not only between the light emitting elements 21 and 22 and the side wall X2 of the package 10 but also between the light emitting element 21 and the light emitting element 22.

While embodiments have been described above, the description merely represents examples and is not intended to limit the construction as defined in the scope of the claims in any way whatsoever.

What is claimed is:

1. A method for manufacturing a light emitting device comprising:
   mounting a light emitting element in a recess of a package;
   disposing a light transmissive member above the light emitting element; and
   depositing a sealing resin so as to seal the recess of the package, the sealing resin containing a fluorescent material;
   wherein the fluorescent material is distributed to a side of the light emitting element in a greater amount than to above the light emitting element,
   wherein a side surface of the light emitting element is exposed to the sealing resin, and
   wherein a portion of the light transmissive member protrudes from the sealing resin.

2. The method according to claim 1, wherein the light transmissive member has a cross section with a shape of a circle having a cutaway side that faces the light emitting element in a cross-sectional view.

3. The method according to claim 1, wherein the sealing resin is deposited such that the fluorescent material is deposited on a bottom surface of the recess of the package.

4. The method according to claim 3, wherein the fluorescent material is deposited at a location lower than an active layer of the light emitting element.

5. The method according to claim 1, further comprising:
   prior to disposing the light transmissive member on the light emitting element, connecting the light emitting element and an external electrode of the package via a wire.

6. The method according to claim 1, wherein the light emitting element is mounted by flip-chip mounting.

7. The method according to claim 1, wherein the light transmissive member is bonded to an upper surface of the light emitting element.

8. The method according to claim 1, wherein the light transmissive member is disposed by potting a thermosetting resin on an upper surface of the light emitting element and hardening the thermosetting resin.

9. A method for manufacturing a light emitting device comprising:
   mounting a light emitting element in a recess of a package;
   disposing a light transmissive member on an upper surface of the light emitting element; and
   depositing a light transmissive sealing resin so as to seal the recess of the package,
   wherein a protruding surface attributable to the light transmissive member is formed at an interface in contact with outside air,
   wherein a portion of a surface of the sealing resin around the protruding surface is sunken relative to an outermost periphery of the sealing resin, and
   wherein a portion of the light transmissive member is positioned higher than the sunken portion of the sealing resin.

10. The method according to claim 9, wherein the protruding surface protrudes beyond an opening surface of the recess of the package.

11. The method according to claim 9, wherein the sealing resin contains a fluorescent material.

12. The method according to claim 9, wherein the light transmissive member has a cross section with a shape of a circle having a cutaway side that faces the light emitting element in a cross-sectional view.

13. The method according to claim 11, wherein the sealing resin is deposited such that the fluorescent material is deposited on a bottom surface of the recess of the package.

14. The method according to claim 9, wherein the light transmissive member has a surface that inhibits deposition of the fluorescent material.

15. The method according to claim 9 further comprising:
   prior to providing the light transmissive member on the light emitting element, connecting the light emitting element and an external electrode of the package via a wire.

16. The method according to claim 9, wherein the light emitting element is mounted by flip-chip mounting.

17. The method according to claim 9, wherein the light transmissive member is bonded to an upper surface of the light emitting element.

18. The method according to claim 9, wherein the light transmissive member is disposed by potting a thermosetting resin on an upper surface of the light emitting element and hardening the thermosetting resin.

19. A method for manufacturing a light emitting device comprising:
   mounting a light emitting element in a recess of a package;
   disposing a light transmissive member on an upper surface of the light emitting element; and
   depositing a light transmissive sealing resin so as to seal the recess of the package,
   wherein, in a cross-section of the light emitting device, an interface in contact with outside air has two inflection points at positions lower than a height of an outermost periphery of the sealing resin,
   wherein an interface connecting the two inflection points protrudes upward, and
   wherein a portion of the light transmissive member is positioned higher than the two inflection points.

* * * * *